United States Patent [19]

Nakamura et al.

[11] Patent Number: 5,039,886
[45] Date of Patent: Aug. 13, 1991

[54] CURRENT MIRROR TYPE LEVEL CONVERTERS

[75] Inventors: Kazuyuki Nakamura; Masahide Takada, both of Tokyo, Japan

[73] Assignee: NEC Corporation, Tokyo, Japan

[21] Appl. No.: 528,550

[22] Filed: May 25, 1990

[30] Foreign Application Priority Data

May 26, 1989 [JP] Japan .................................. 1-133110
May 26, 1989 [JP] Japan .................................. 1-133113

[51] Int. Cl.[5] ...................... H03K 19/02; H03K 19/96
[52] U.S. Cl. ................................. 307/475; 307/451; 307/542; 307/546; 307/553; 330/257; 330/288
[58] Field of Search .............. 307/443, 448, 451, 475, 307/542, 546, 553; 330/288, 257

[56] References Cited

U.S. PATENT DOCUMENTS

| 4,808,852 | 2/1989 | Kovsaka et al. | 307/475 |
| 4,847,522 | 7/1989 | Fuller et al. | 307/475 |
| 4,883,988 | 11/1989 | Ide et al. | 307/475 |

FOREIGN PATENT DOCUMENTS

62-154917 12/1985 Japan .

Primary Examiner—Stanley D. Miller
Assistant Examiner—Margaret Rose Wambach
Attorney, Agent, or Firm—Whitham & Marhoefer

[57] ABSTRACT

A current mirror type level converter which makes it unnecessary to prepare the complementary signals of input signals by connecting a load transistor which is in the normally energized state regardless of the states of the input signals to the side where a mirror current flows and the load transistor also determines the output level. Further, a mirror input current is caused to flow by the result of a logic operation of the input signals, a mirror current supplying transistor is shared among a plurality of current mirror type level converters, an output signal is fed back positively accompanying a delay, and a feedback transistor to whose control terminal is applied the positive feedback signal is connected in parallel with the load transistor in order to realize an increase in the speed of the operation of the converter.

20 Claims, 6 Drawing Sheets

CURRENT MIRROR TYPE LEVEL CONVERTERS

BACKGROUND OF THE INVENTION

Field of the Invention

The present invention relates to current mirror type level converters and, more particularly, to current mirror type level converters utilizing MOS (Metal Oxide Semiconductor) transistors and performing a logic operation on input signals supplied thereto.

In recent years, Bi-CMOS circuits combining the respective characteristics of a bipolar transistor circuit and a CMOS (Complementary MOS) transistor circuit have been widely employed in integrated circuits. Integrated circuits employing Bi-CMOS circuits can operate at a high speed and with low power consumption by combining a bipolar transistor ECL (emitter coupled logic) circuit having high speed operation and a CMOS transistor circuit having low power consumption operation. A typical example is a memory circuit which uses CMOS transistors for memory cells and/or peripheral circuits thereof and an ECL circuit for interfacing with an external circuit.

However, since an ECL circuit and a CMOS circuit have different logic levels, a level converter is required therebetween to couple these circuits.

As an example of such level converters a current mirror type level converter is disclosed in Japanese Laid-Open Patent Application No. 62-154917. However, this converter requires true and complementary logic levels of input signal(s) for switching the mirror current, and hence the circuit construction becomes complicated and there is unavoidable signal propagation delay. These drawbacks become more conspicuous when a logic operation on two or more input signals is added to the level converter and/or when the number of logic stages is increased.

SUMMARY OF THE INVENTION

It is, therefore, an object of the present invention to provide a current mirror type level converter which has a simplified circuit constitution.

It is another object of the present invention to provide a current mirror type level converter which eliminates complementary logic level(s) of input signal(s).

It is still another object of the present invention to provide a current mirror type level converter which can reduce the delay time of signal transmission.

A level converter according to the present invention comprises a current mirror circuit having an input transistor and an output transistor which produces an output current responsive to an input current flowing through the input transistor, a transistor circuit coupled to the input transistor of the current mirror circuit and supplied with at least one input signal, the transistor circuit controlling the supply of the input current to the input transistor of the current mirror circuit in response to logic levels of the input signal, and a load transistor coupled to the output transistor of the current mirror circuit and supplied with a voltage that turns the load transistor ON irrespective of the logic levels of the input signal.

When the transistor circuit supplies no input current to the input transistor of the current mirror circuit in response to one logic level of the input signal, the output transistor is turned OFF, while the load transistor is held at the conductive state. An output signal of a logic high level (or a logic low level) is derived from the coupling node of the output transistor and the load transistor. On the other hand, when the transistor circuit supplies the input signal to the input transistor in response to the other logic level of the input signal, the output transistor is turned ON. The conductive resistance of the output transistor is designed to be smaller than that of the load transistor, and therefore the output signal takes a logic low level (or a logic high level). Thus, the level converter can convert the input signal of ECL logic level into an output signal of CMOS logic level only by using the true logic level of the input signal. No complementary logic level of the input signal is required.

In a preferred embodiment, the transistor circuit is constructed by a plurality of transistors coupled in series and/or in parallel and supplied with the respective ones of a plurality of input signals. In this case, a desired logic operation on the input signals is performed. According to another preferred embodiment, the load transistor is coupled in parallel with an additional load transistor which is in turn supplied with a delayed signal of the output signal. The operation speed is further improved.

BRIEF DESCRIPTION OF THE DRAWINGS

The above and other objects, features and advantages of the present invention will become more apparent from the following description taken in conjunction with the accompanying drawings, wherein.

DETAILED DESCRIPTION OF THE PRIOR ART

Figures 1, 2, 3, 4, 5:
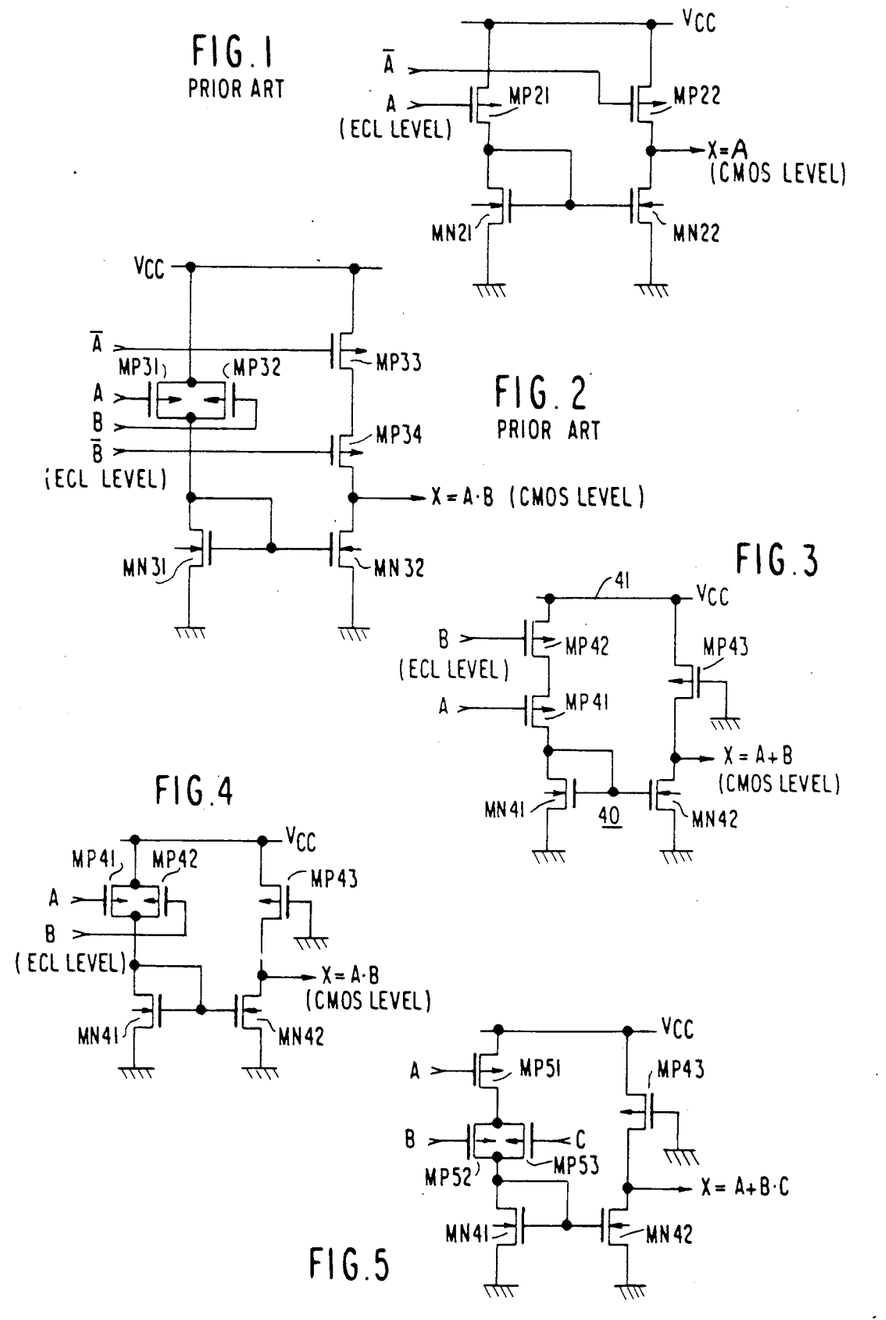
FIGS. 1 and 2 each shows a prior art current mirror type level converter disclosed in the reference cited above.
FIG. 3 shows a first embodiment of the current mirror type level converter of the present invention.
FIG. 4 shows a second embodiment of the current mirror type level converter of the present invention.
FIG. 5 shows a third embodiment of the current mirror type level converter of the present invention.

Referring to FIG. 1, there is shown a prior art current mirror type level converter disclosed in FIG. 8 of the above referenced, Japanese Laid-Open Patent Application No. 62-154917. This level converter converts a signal A of ECL level, the logic high level thereof being about (Vcc - 0.8) volts and the logic low level voltage thereof being about (Vcc - 1.6) volts, into a signal X of CMOS level, the logic high level thereof being nearly equal to Vcc and the low level voltage thereof being nearly equal to the ground voltage. Vcc represents a power supply voltage. The level converter consists of two P-channel MOS transistors MP21 and MP22 and two N-channel MOS transistors MN21 and MN22 connected as shown. True and complementary signals A and $\overline{A}$ of the signal to be converted are supplied to the transistors MP21 and MP22, respectively. The transistors MN21 and MN22 are connected to form a current mirror circuit. The signal X of the CMOS level is derived from the connection node of the transistors MP22 and MN22. As well known in the art, the current flowing through the transistor MN22 is proportional to that flowing through the transistor MN21.

In operation, when the true and complementary logic levels A and $\overline{A}$ of the input signal are the high and low levels, respectively, the transistor MP21 is turned OFF to supply no current to the current mirror circuit of MN21 and MN22, while the transistor MP22 is turned ON. The output signal X thus takes Vcc level (i.e., the logic high level). When the levels A and $\overline{A}$ of the input signal are the low and high levels, respectively, the transistors MP21, MN21 and MN22 are turned ON and the transistor MP22 is turned OFF. The output signal X thereby takes the ground level (i.e., the logic low level). Thus, the input signal A of the ECL level is converted into the output signal X of the CMOS level.

The above reference further discloses in FIG. 1 thereof a circuit performing not only a level conversion operation but also a logic operation on two input signals. This circuit is shown in FIG. 2 in the drawings. The circuit includes four P-channel MOS transistors MP31 to MP34 and two N-channel MOS transistors MN31 and MN32 connected as shown.

In operation, when the logic levels of the ECL input signals A($\overline{A}$) and B($\overline{B}$) are such that A is the high level ($\overline{A}$ is the low level) and B is the high level ($\overline{B}$ is the low level), both of the transistors MP31 and MP32 are in the non-conductive state and no input current is supplied to the current mirror of MN31 and MN32. On the other hand, transistors MP33 and MP34 are both in the conductive state, so that the output signal X goes to the high voltage of the Vcc level. When at least one of the input signals A and B is at the low level, the transistor MP31 or MP32 is turned ON to supply the input current to the transistor MN31. A current proportional to the input current flows in the transistor MN32. On the other hand, at least one of the transistors MP33 and MP34 is in the non-conductive state, so that the output signal X is turned to the low voltage of the ground level.

Thus, the circuit in FIG. 21 performs the logic-product operation (AND) on two inputs A and B, X=A·B, along with performing a level converting operation.

However, there is a shortcoming that the true and complementary logic levels of the input signals A and $\overline{B}$ have to be generated. Consequently, when such a circuit is used in a circuit (structure) having a large number of logic stages, the number of transistors is increased, resulting in a complicated circuit and large signal transmission or propagation delay.

DETAILED DESCRIPTION OF THE PREFERRED EMBODIMENTS

Turning now to FIG. 4, there is shown a current mirror type level converter according to the first embodiment of the present invention. This circuit includes N-channel MOS transistors MN41 and MN42 connected to form a current mirror 40, two P-channel MOS transistors MP41 and MP42 connected in series between the input transistor MN41 of the current mirror 40 and a power voltage (Vcc) line 41, and a P-channel MOS transistor MP43 connected between the output transistor MN42 of the current mirror 40 and the Vcc line 41 and having a gate connected to the ground. The transistor MP43 is thus held in the conductive state. Only the true logic levels of input signals A and B of the ECL level are used and supplied to the transistors MP41 and MP42, respectively, and complementary logic levels thereof are not required. An output signal X is derived from the connection node of MP43 and MN42.

In operation, when at least one of the inputs A and B is at the high level ("A"), the transistor MP41 or MP42 is in the conductive state, so that no current flows into the transistor MN41. The transistors MN41 and MN42 are thereby turned OFF. Since the transistor MP43 is in the conductive state, on the other hand, the output signal X takes the Vcc level that is the logic high level of the CMOS level. When both of the input signals A and B are at a low level ("L"), the transistors MP41 and MP42 are turned ON to supply an input current to the transistor MN41. The transistor MN42 is thereby turned ON to produce a current proportional to the input current. The level of the output signal X is thus determined by the ratio of the conductive resistance of the transistor MN42 and that of the transistor MP43. Since the transistor MN42 is formed with a size several times larger than the transistor MP43, the output signal X takes a level close to the ground potential that is the low level of the CMOS level. Thus, the circuit shown in FIG. 3 performs not only a logic-sum (OR) operation of two, input signals A and B, X=A+B, but also a level converting operation from the ECL level to the CMOS level.

If desired the transistor MP43 may be applied with not the ground potential, but an appropriate bias voltage, by appropriately designing the size ratio of the transistors MP43 and MN42.

It is noted that a d.c. current flows through the transistors MN42 and MP43 only when both of the input signals A and B are at low and does not flow when at least one of the input signals A and B is at high.

Since only true logic levels of input signals are required to the circuit of the present invention, it is easy to adopt a circuit which outputs X=A·B by connecting the transistors MP41 and MP42 in parallel between the Vcc line 41 and the transistor MN41, as shown in FIG. 4 as the second embodiment.

Further, it is possible to realize more complicated logic structures by combining these serial connections and parallel connections. Such an example is shown in FIG. 5 as the third embodiment, wherein transistors MP52 and MP51 are connected in series and a transistor MP53 is connected in parallel to the transistor MP52. Three input signals A, B and C are supplied to the transistors MP51, MP52 and MP53, respectively. This circuit performs a logic operation of "X=A+B·C" and a level converting operation.

Figure 6:
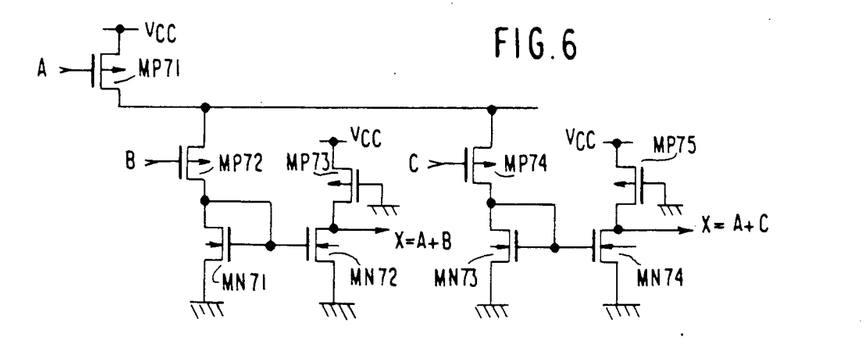
FIG. 6 shows a fourth embodiment of the current mirror type level converter of the present invention.

FIG. 6 is the fourth embodiment of the present invention which executes the two logic operations X=A+B and Y=A+C, on three input signals A, B and C, as well as the relevant level conversions. In this embodiment, the first input signal A is used in common to perform two logic operations. Therefore, this circuit shares a P-channel MOS transistor MP71 for receiving the input signal A. The input signal B is supplied to a P-channel MOS transistor MP72 connected between MP71 and an N-channel MOS transistor MN71, and the input signal C is supplied to a P-channel MOS transistor MP74 connected between MP71 and an N-channel MOS transistor MN73. Two pairs of N-channel MOS transistors (MN71 and MN72) and (MN73 and MN74) form current mirrors, respectively. The gates of P-channel MOS transistors MP73 and MP74 are grounded. Since, the transistor MP71 is used in common, it becomes possible to simplify the circuit composition by choosing such a constitution.

In such a case as C=B̄ in the figure, the maximum number of level converters among the level converter group through which a mirror input current flows is one, so that the gate size of the shared MOS transistor MP71 for inputting the signal A can be chosen to be comparable to those of the other input MOS transistors MP72 and MP74, and the input capacitance for the input A can be reduced. Therefore, it is possible to increase the processing speed of the device. This means that it is possible to achieve a further simplification of the circuit structure and an increase in the processing speed by a combined use of a plurality of logic type level converters.

Figures 7, 8, 9, 10:
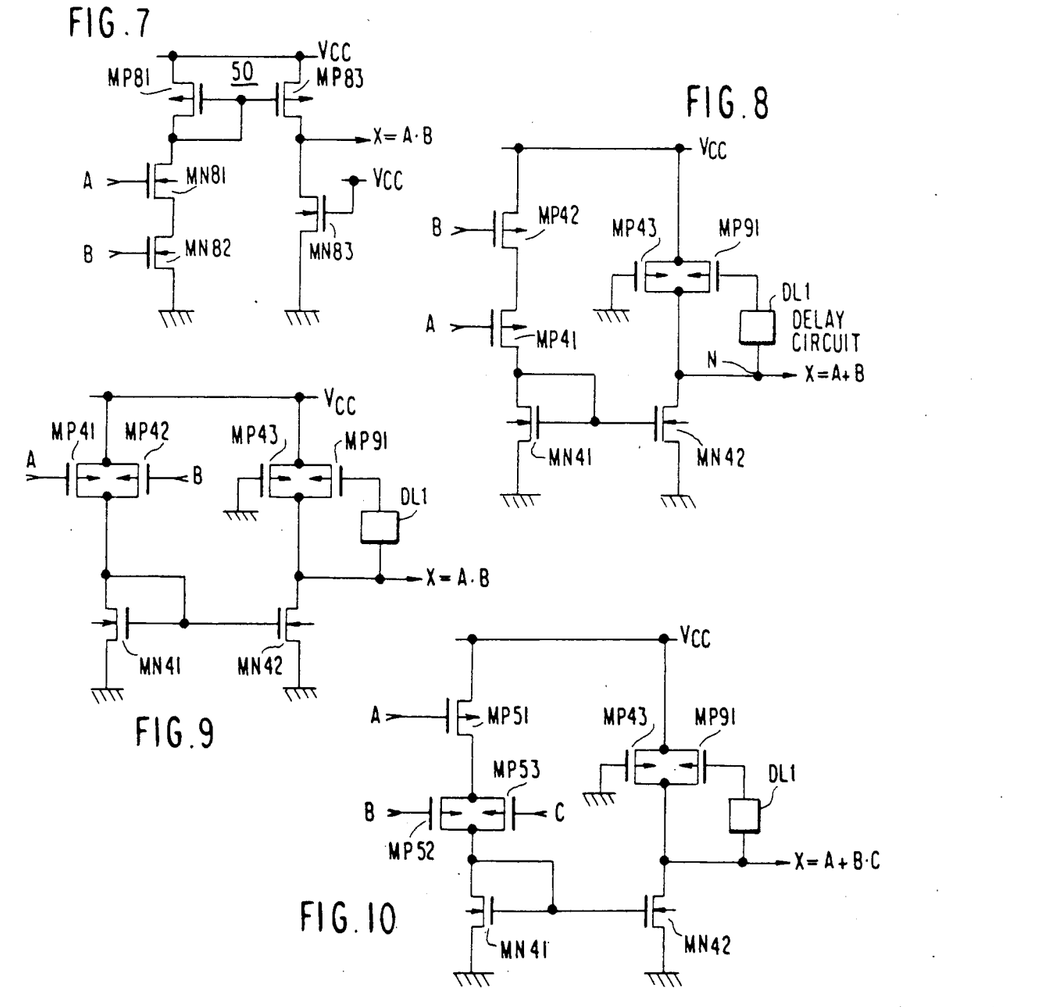
FIG. 7 shows a fifth embodiment of the current mirror type level converter of the present invention.
FIG. 8 shows a sixth embodiment of the current mirror type level converter of the present invention.
FIG. 9 shows a seventh embodiment of the current mirror type level converter of the present invention.
FIG. 10 shows an eighth embodiment of the current mirror type level converter of the present invention.
Figure 11:
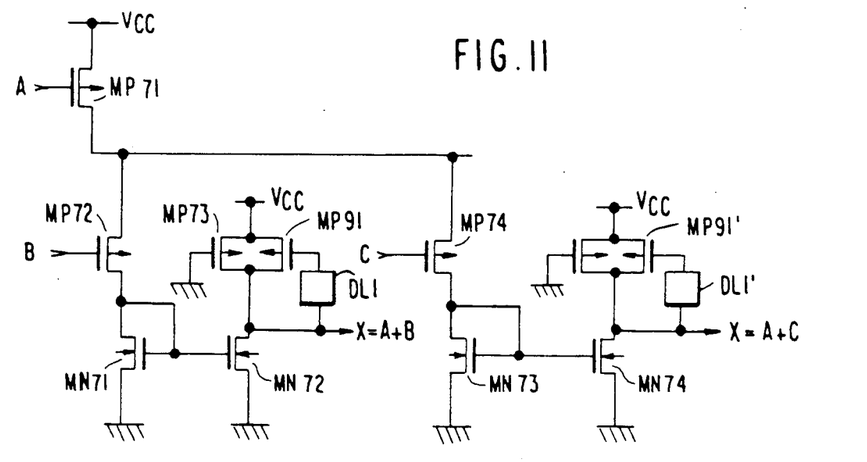
FIG. 11 shows a ninth embodiment of the current mirror type level converter of the present invention.

FIG. 7 shows the fifth embodiment in which N-channel MOS transistors MN81 and MN82 are used as input transistors supplied with input signals A and B and an N-channel MOS transistor MN83 is used as a load transistor of current mirror 50 composed of P-channel MOS transistors MP81 and MP82. The circuit shown here is effective when used for levels close to the ground potential and in such a case where input ECL signals are level shifted. Here, the source voltage Vcc is applied to the gate of the transistor MN83 in order to keep it in the normally energized state.

Although in the first to fifth embodiment, each of the MOS transistors MP43, MP73, MP75 and MN83 is kept in the on-state by applying a constant voltage (the grounding voltage or the source voltage) to its gate, it need not be a constant voltage, and may be a varying voltage. In any case, it suffices if these MOS transistors can be kept in the normally energized state.

FIG. 8 shows the level converter according to the sixth embodiment of the present invention, in which the same constituents as those shown in FIGS. 3 to 7 are denoted by the same reference characters to omit the further description thereof. The circuit shown in FIG. 8 is different from the circuit shown in FIG. 3 in that a P-channel MOS transistor MP91 is connected in parallel to the transistor MP43 and a delay circuit DL1 is connected between the gate of MP91 and the output terminal (X) to supply the voltage of the output signal X to the gate of the transistor MP91. The circuit shown here also performs voltage level conversion of the internal output terminal N to the low level voltage of the CMOS logic.

In a series of operations in the above, the present level converter carries out a logic operation on two input signals A dn B, X=A+B, as well as the level conversion operation from the ECL level to the CMOS logic level, similarly to the circuit of FIG. 3.

The role of the delay circuit DL1 and the transistor MP91 in the present embodiment is to increase the response speed of the output signal X responsive to the change in logic level of the input signals A and B. As an example, suppose that at least one of the input signals A and B change from the low level to the high level. In this case, the output signal X changes from the low level to the high level. When the output signal X is at the low level, the transistors MP43 and MP91 are both in the conductive state. As the input signals A and B change to the high level, the voltage of the output signal X starts to rise from the low level to the high level. At this time, the voltage of the output signal X is not immediately applied to the gate of the transistor MP91 because of the delay circuit DL1, so that the transistor MP91 is maintained at the conductive state to accelerate the voltage rise of the output signal X. The output signal X is thereby inverted to the high level with a quick response. When the high level appears at the output node of the delay circuit DL1, the transistor MP91 is turned OFF.

Next, consider the case where both of the input signals A and B change from the high level to the low level or one of the signals A and B changes from the high level to the low level with the other of them being held at the low level. In this case, the output signal X changes from the high level to the low level. When the output signal X is at the high level, the transistor MP91 alone is in the non-conductive state. When the above case occurs, the output signal X starts to drop from the high level to the low level. However, the delay circuit DL1 prevents the change of the output signal X to the low level from being supplied to the transistor MP91, to maintain it at a non-conductive state for the delay period. Therefore, the transistor MN42 can invert the output signal X to the low level immediately. By designing the channel width of the transistor MP43 small to set a small current supply capability, the speed up effect for dropping the output signal X is more effective. The transistor MP91 is finally turned ON.

As in the above, the present level converter has the advantage that it can execute the transition between the high and low levels of the output signal by means of the delay circuit DL1 and the transistor MP91, and at the same time possesses the logic processing function.

The circuit part consisting of the transistor MP91 and the delay circuit DL1 can be applied to the circuits shown in FIGS. 4, 5, 6 and 7, respectively. The resultant circuit constructions are shown in FIGS. 9, 10, 11 and 12, respectively, wherein the same constituents as those shown in the previous drawings are denoted by the same reference characters.

Figures 12, 13, 14:
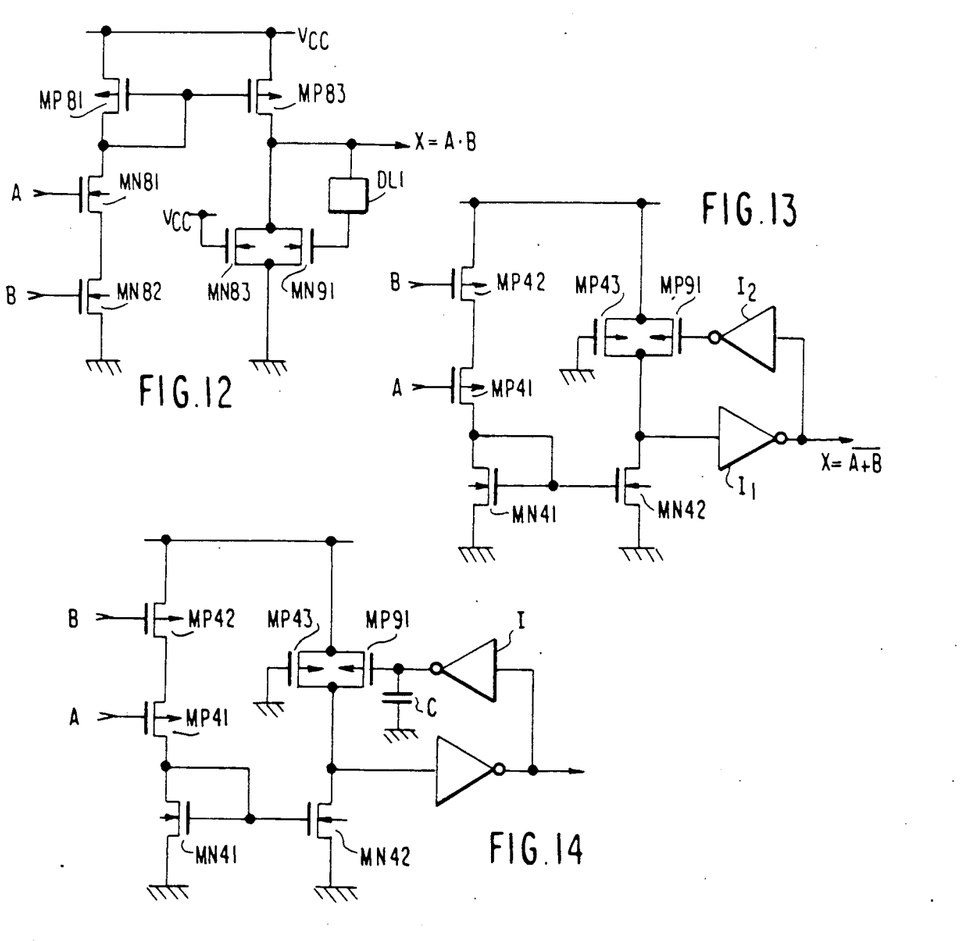
FIG. 12 shows a tenth embodiment of the current mirror type level converter of the present invention.
FIG. 13 shows an eleventh embodiment of the current mirror type level converter of the present invention.
FIG. 14 shows a twelfth embodiment of the current mirror type level converter of the present invention.

As the delay circuit DL1, a plurality of inverters connected in series, the number of which is even, can be employed. A circuit employing two inverters as the delay circuit is shown in FIG. 13, in which two inverters I1 and I2 are connected in series between MP91 and the node of MP91 and MN42. In this embodiment the output signal X is derived from the output of the first inverter I1. Accordingly, in addition to being able to accomplish a more perfect level conversion of the CMOS logic voltage of the internal output terminal N by means of the inverter I1, it becomes possible to realize a high speed level conversion processing even when the load capacitance for the output signal X is large, by making the size of the constituent transistor of the inverter I1 sufficiently large. The output signal X for this case outputs the logic of $\overline{A+B}$.

The inverter I2 is used for further inverting X in order to apply the voltage of the internal output terminal N to the gate of the transistor MP91, and in addition, it has an advantage of enabling one to arbitrarily set the delay time by adjusting the size of the constituent transistor.

The embodiment in FIG. 14 is a circuit composition that may be used when it is desired to further increase the delay time by adding a capacitor C to the output of the inverter I2 of the circuit composition in FIG. 13.

In the above embodiments, including the delay circuit DL1, other types of the delay circuit may be used for the present invention.

Next, the effect of the current mirror type level converters of the present invention constructed as in the above will be described.

Figure 15:
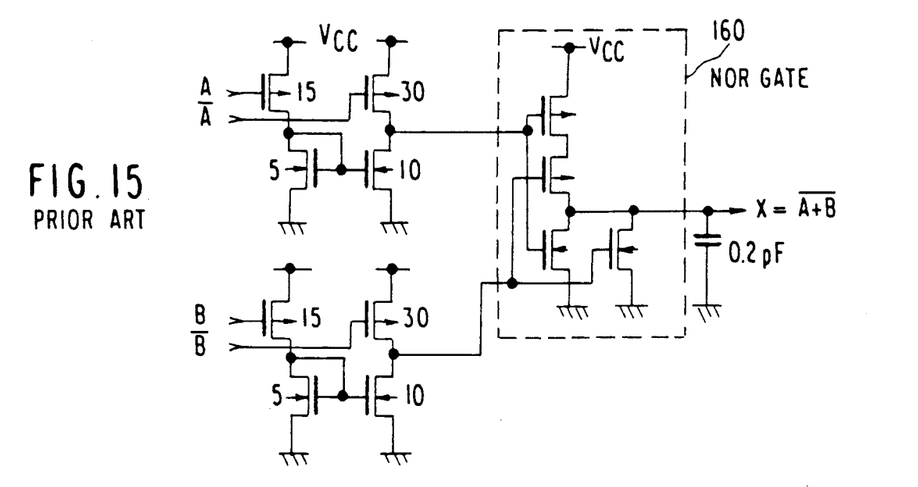
FIG. 15 shows a first conventional example employing the circuit shown in FIG. 1.
Figure 16:
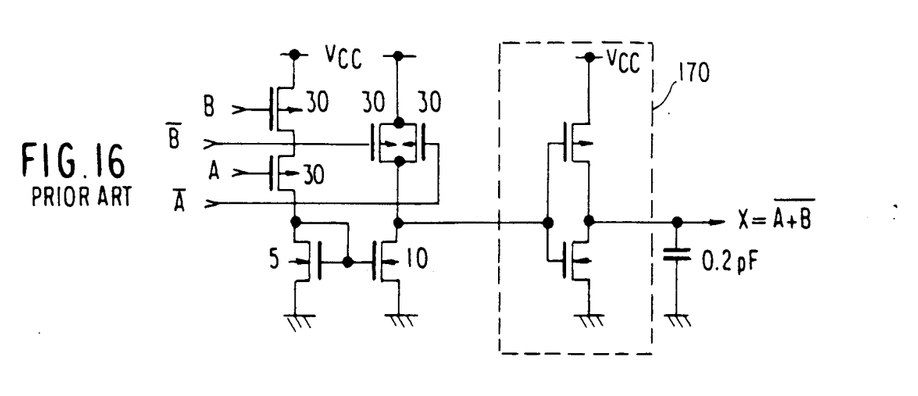
FIG. 16 shows a second conventional example employ the concept of the circuit shown in FIG. 2.
Figure 17:
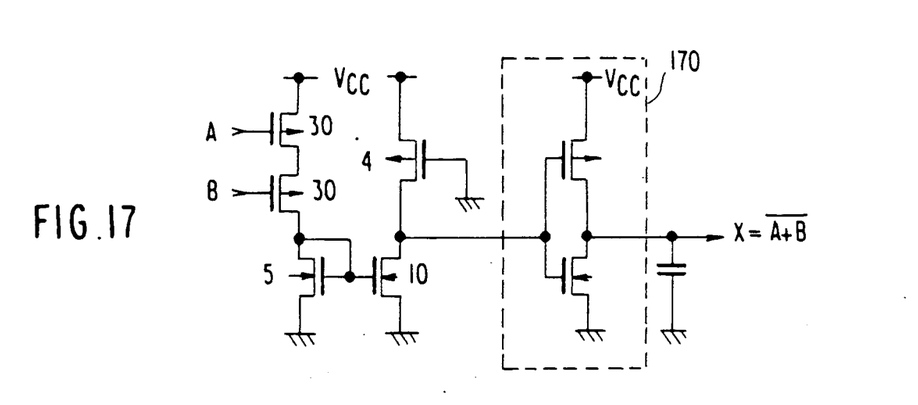
FIG. 17 shows an application of the first embodiment.

FIG. 15, FIG. 16 and FIG. 17 show two conventional examples and an application of the present invention, respectively, which are chosen to demonstrate the simplification in the circuit composition and increase in speed achievable by the present invention. Each of the circuits shown in FIGS. 15, 16 and 17 performs a NOR operation on two input signals A and B, $X=\overline{A+B}$, as well as a logic level converting operation from the ECL level to the CMOS level. The circuit of FIG. 15 utilizes the circuit of FIG. 1 to convert the ECL level into the CMOS level. Since the circuit of FIG. 1 has only the level converting function, another set of the circuit of FIG. 1 and the NOR gate 160 of the CMOS structure are required to perform the NOR operation on the two input signals A and B. This circuit is called hereinafter Type-I circuit. FIG. 16 utilizes the technical concept of the circuit shown in FIG. 2 and realizes a NOR circuit by connecting the transistors MP31 and MP32 in series, connecting the transistors MP33 and MP34 in parallel and providing a CMOS inverter 170. This circuit is called hereinafter Type-II circuit. The circuit of FIG. 17 utilizes the circuit of FIG. 3, which is the first embodiment of the present invention, and realizes a NOR circuit by providing a CMOS inverter 170. This circuit is called hereinafter Type-III circuit.

As apparent form FIGS. 15, 16 and 17, the Type III circuit is constructed with the minimum number of transistors, compared to the Type-I and Type-II circuits. Moreover, any complementary logic levels of the input signals A and B are not required to the Type-III circuit.

Further, the operation delay times of the Type-I, Type-II and Type-III circuits above are obtained by simulation, and the speeds of operation are compared. As device parameters, a power voltage is $-5.2$ V (i.e., the Vcc line 41 is grounded and $-5.2$ V is used in place of a ground voltage), and an output load capacitance is 0.2 pF. The values shown in FIGS. 15, 16 and 17 represent the sizes of the respective transistors (W/L = gate width/ gate length) employed therein.

Figure 18:
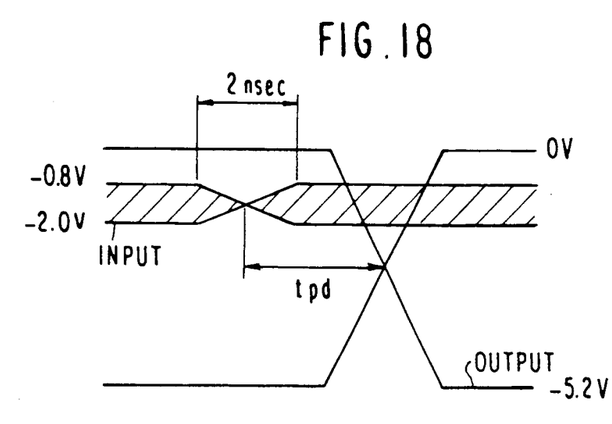
FIG. 18 shows the relation between the input and output signals defined for explaining the effect of the present invention.
Figure 19:
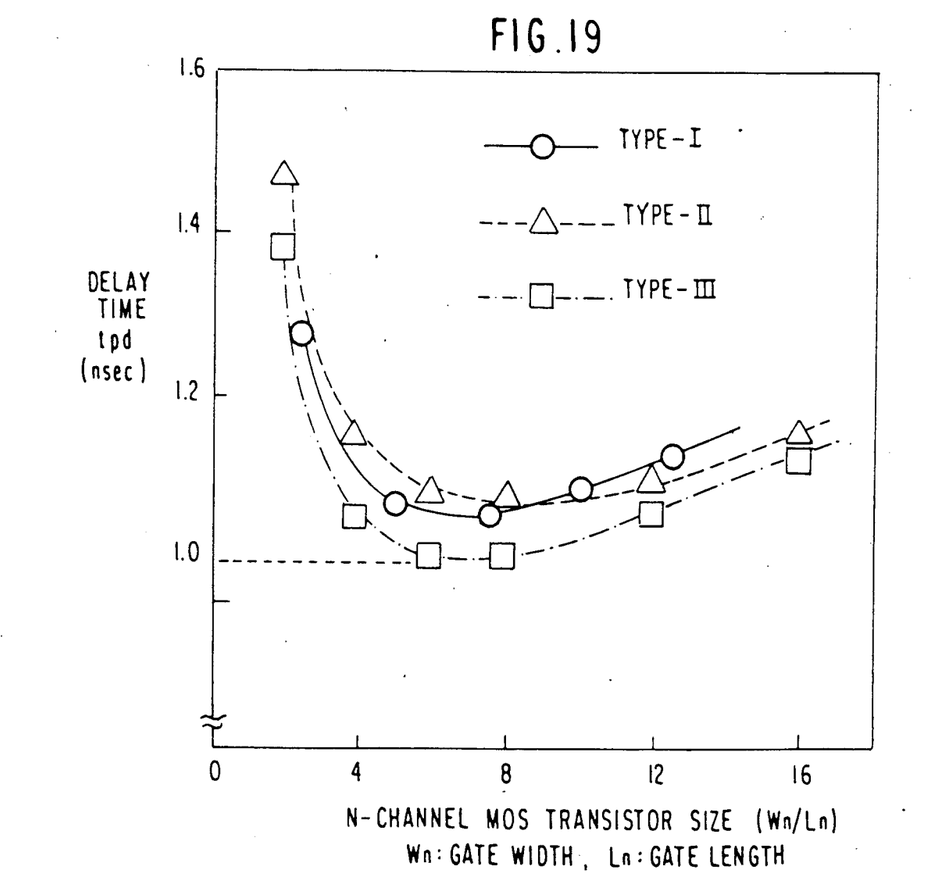
FIG. 19 shows the simulation result on the delay time for the conventional examples in FIGS. 16, 17 and 18.

FIG. 19 shows a graph representing a comparison resultant of the speeds of the respective type circuits when the size of the N channel MOS transistor of the output buffer part (the NOR gate 160 of Type-I circuit and the inverter 170 of the Type-II and Type-III circuits) is varied. Note that the size of each of the P channel MOS transistors of the buffer part is set at 4 times that of each of the N channel MOS transistors therein for the Type-I, and 2.5 times for Type-II and Type III, and the relationship of the output signal to the input signal is defined as shown in FIG. 18. As a result, it is found that the Type-III circuit according to the present invention operates at the highest speed.

The following Table 1 shows the result of a comparison of the input signal number, the total FET number and the minimum delay for the level converters 5 of Type-I, Type-II and Type-III. For Type-II, the FET number is two thirds of Type-III, but the input signal number and the minimum delay time are substantially equal to those of Type-I. For Type-III, the circuit composition is simpler compared with Type-I and Type-II since the complementary signals are not needed as inputs, and the operation is the fastest.

TABLE 1

|  | Type-I | Type-II | Type-III |
|---|---|---|---|
| Input Signal Number | 4 | 4 | 2 |
| Total FET Number | 12 | 8 | 7 |
| Minimum Value of Normalized Delay time | 1.06 (nsec) | 1.08 (nsec) | 1.00 (nsec) |

It is apparent that in the case of performing a logic operation on three or more inputs, Type-III circuit becomes more advantageous for the input signal number and the total FET number. Especially in Type-III, a circuit structure which makes it possible to obtain signals of CMOS level by freely taking logic from signals in a high load wiring that are transmitted at the ECL level, becomes realizable with a simple circuit composition.

Figure 20:
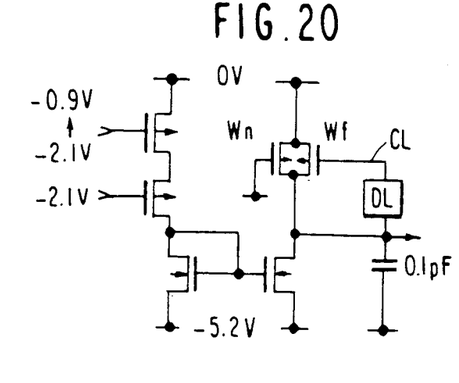
FIG. 20 shows another application using the circuit ,, shown in FIG. 8.

FIG. 20 is a current mirror type level converter for showing the effect of speed increase due to the delay circuit of the present invention, where the structure is the same as that of the sixth embodiment (FIG. 8) except for the power voltage value.

Figure 21:
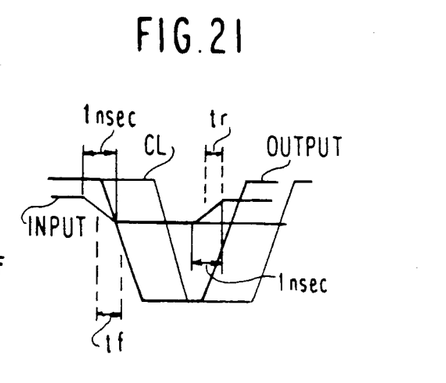
FIG. 21 shows the relation between the input and output signals defined for explaining the effect of the present invention.
Figure 22:
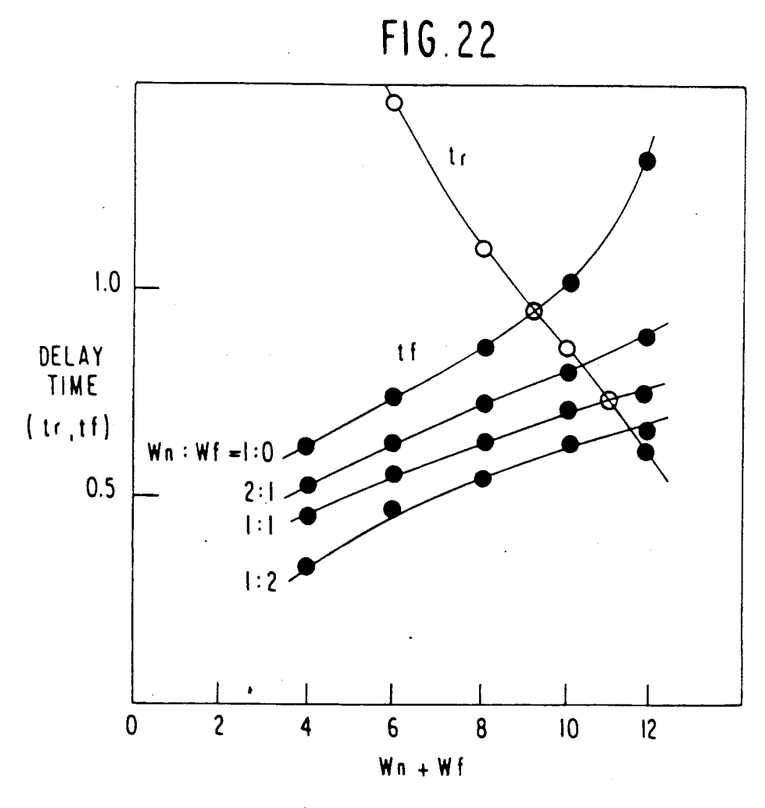
FIG. 22 shows the simulation result on the delay time for the application in FIG. 21.

The pulse rise time $t_r$ and the pulse fall time $t_f$ obtained by varying the ratio of the gate widths $w_n$ and $w_f$ of the two P channel MOS transistors on the mirror current side of the present circuit for the input and output pulses with the waveforms as shown in FIG. 21 are shown in FIG. 22.

It is to be noted that $w_n: w_f=1:0$ is equivalent to the case when there is no feedback from the internal output terminal, and accordingly corresponds to the first embodiment (FIG. 3). When the delay circuit DL1 is added as in the sixth embodiment, it will be seen from FIG. 22 that the delay time is decreased with the increase in the ratio of the gate width $w_f$. In the case of $w_n: w_f=1:1$, the speed is increased by about 30% compared with the case of $w_n: w_f=1:0$.

Although the invention has been described with reference to specific embodiments, this description is not meant to be construed in a limiting sense. Various modifications of the disclosed embodiments will become apparent to persons skilled in the art upon reference to the description of the invention. It is therefore, contemplated that the appended claims will cover any modifications or embodiments as fall within the true scope of the invention.

What is claimed is:

1. A transistor level converter circuit comprising:
   a current mirror circuit having an input transistor and an output transistor, said output transistor being connected to said input transistor to produce an output current at an output in response to an input current flowing through said input transistor,
   a signal input circuit having at least one transistor connected in series with said input transistor, said input circuit controlling a supply of said input current to said input transistor in response to at least one input voltage signal, said input voltage signal having one of two logic levels, and
   a load transistor connected in series with said output transistor of said current mirror circuit and supplied with a constant voltage that turns said load transistor ON regardless of logic levels of said at least one input signal, an output voltage signal from said load transistor having a logic level determined by a logic level of said input voltage signal.

2. The transistor level converter circuit as claimed in claim 1, wherein said signal input circuit includes a plurality of transistors each connected in series with said input transistor of said current mirror and supplied with a different one of a plurality of input voltage signals, each of said plurality of input voltage signals having one of two logic levels and said input circuit supplying said input current when said plurality of input voltage signals has a predetermined logic level combination.

3. The transistor level converter circuit as claimed in claim 1, further comprising:
   a delay circuit for delaying a voltage level at a connection point of said output and said load transistor, and
   a feedback transistor supplied with an output of said delay circuit and connected in parallel to said load transistor, said delay circuit and feedback transistor increasing a response speed of said output voltage signal responsive to a change in logic level of said input voltage signal.

4. The transistor level converter circuit as claimed in claim 2 wherein said input and output transistors of said current mirror circuit are MOS transistors of a first conductivity type and said plurality of transistors of said input circuit and said load transistor are MOS transistors of a second conductivity type, and wherein said plurality of transistors comprise at least first and second transistors connected in series and receiving first and second input voltage signals, said output voltage signal having a level which is the logical sum of the logical levels of said first and second input voltage signals.

5. The transistor level converter circuit as claimed in claim 4 further comprising an inverter connected to a connection point of said output and load transistors, said output voltage signal being supplied by said inverter.

6. The transistor level converter circuit as claimed in claim 4, further comprising:
   a delay circuit for delaying a voltage level at a connection point of said output and load transistors, and
   an MOS feedback transistor of the same conductivity type as said load transistor ad supplied with an output of said delay circuit and connected in parallel with said load transistor, said delay circuit and feedback transistor increasing a response speed of said output voltage signal responsive to changes in logic levels of said first and second input voltage signals.

7. The transistor level converter circuit as claimed in claim 6 wherein said delay circuit comprises:
   a first inverter connected to said connection point of said output and load transistors, said output voltage signal being output by said first inverter, and
   a second inverter connected to said first inverter and to said feedback transistor.

8. The transistor level converter circuit as claimed ian claim 7 wherein said delay circuit further comprises a capacitor connected in shunt between an output of said second inverter and said feedback transistor.

9. The transistor level converter circuit as claimed in claim 4 wherein said plurality of transistors further comprise a third transistor connected in parallel with said second transistor and receiving a third input voltage signal, said output voltage signal having a level which is the logical sum of said first input voltage signal and the logical product of said second and third input voltage signals.

10. The transistor level converter circuit as claimed in claim 9 further comprising an inverter connected to a connection point of said output and load transistors, said output voltage signal being supplied by said inverter.

11. The transistor level converter circuit as claimed in claim 9, further comprising:
   a delay circuit for delaying a voltage level at a connection point of said output and load transistors, and
   an MOS feedback transistor of the same conductivity type as said load transistor and supplied with an output of said delay circuit and connected in parallel with said load transistor, said delay circuit and feedback transistor increasing a response speed of said output voltage signal responsive to changes in logic levels of said first, second and third input voltage signals.

12. The transistor level converter circuit as claimed in claim 11 wherein said delay circuit comprises:
   a first inverter connected to said connection point of said output and load transistors, said output voltage signal being output by said first inverter, and
   a second inverter connected to said first inverter and to said feedback transistor.

13. The transistor level converter circuit as claimed in claim 12 wherein said delay circuit further comprises a capacitor connected in shunt between an output of said second inverter and said feedback transistor.

14. The transistor level converter circuit as claimed ian claim 2 wherein said input and output transistors of said current mirror circuit are MOS transistors of a first conductivity type and said plurality of transistors of said input circuit and said load transistor are MOS transistors of a second conductivity type, and wherein said plurality of transistors comprise at least first and second transistors connected in parallel and receiving first and second input voltage signals, said output voltage signal having a level which is the logical product of the logical levels of said first and second input voltage signals.

15. The transistor level converter circuit as claimed in claim 14 further comprising an inverter connected to a connection point of said output and load transistors, said output voltage signal being supplied by said inverter.

16. The transistor level converter circuit as claimed in claim 14, further comprising:

a delay circuit for delaying a voltage level at a connection point of said output and load transistors, and an MOS feedback transistor of the same conductivity type as said load transistor and supplied with an output of said delay circuit and connected in parallel with said load transistor, said delay circuit and feedback transistor increasing a response speed of said output voltage signal responsive to changes in logic levels of said first and second input voltage signals.

17. The transistor level converter circuit as claimed in claim 16 wherein said delay circuit comprises:
a first inverter connected to said connection point of said output and load transistors, said output voltage signal being output by said first inverter, and
a second inverter connected to said first inverter and to said feedback transistor.

18. The transistor level converter circuit as claimed in claim 17 wherein said delay circuit further comprises a capacitor connected in shunt between an output of said second inverter and said feedback transistor.

19. A transistor level converter circuit comprising:
first and second current mirror circuits, each of which includes an input transistor and an output transistor, said output transistor being connected to said input transistor to produce an output current proportional to an input current flowing through said input transistor,
first and second transistors connected in series to said input transistor of said first current mirror circuit and supplied with first and second input voltage signals, respectively, said first and second input voltage signals each having one of two logic levels,
a third transistor connected between said input transistor of said second current mirror circuit and a connection point of said first and second transistors and supplied with a third input voltage signal, said third input voltage signal having one of two logic levels,
fourth and fifth transistors connected to the output transistors of said first and second current mirror circuits, respectively, and
means for turning said fourth and fifth transistors ON irrespective of logic levels of said first, second and third input signals, first and second output voltage signals from said fourth and fifth transistors, respectively, having logic levels determined by logic levels of said first and second input voltage signals and by logic levels of said first and third input voltage signals, respectively.

20. The transistor circuit as claimed in claim 19, further comprising:
sixth and seventh transistors connected in parallel to said fourth and fifth transistors, respectively, and
first and second delay circuits coupled between said sixth transistor and the output transistor of said first current mirror circuit and between said seventh transistor and the output transistor of said second current mirror circuit, said first delay circuit and said sixth transistor and second delay circuit and said seventh transistor respectively increasing a response speed of said first and second output voltage signals responsive to changes in logic levels of said first and second or said first and third input voltage signals, respectively.

* * * * *